United States Patent
[19]

Wu

[11] Patent Number: 6,069,057

[45] Date of Patent: May 30, 2000

[54] METHOD FOR FABRICATING TRENCH-ISOLATION STRUCTURE

[75] Inventor: Shye-Lin Wu, Hsinchu Hsien, Taiwan

[73] Assignee: Powerchip Semiconductor Corp., Hsin-chu, Taiwan

[21] Appl. No.: 09/081,394

[22] Filed: May 18, 1998

[51] Int. Cl.[7] .................................................. H01L 21/76
[52] U.S. Cl. ........................ 438/424; 438/433; 438/437; 148/DIG. 50
[58] Field of Search .................................. 438/424, 427, 438/433, 435, 437, 296; 148/DIG. 50

[56] References Cited

U.S. PATENT DOCUMENTS

| H204 | 2/1987 | Oh et al. ................................. | 438/433 |
|---|---|---|---|
| 4,523,369 | 6/1985 | Nagakubo .............................. | 438/433 |
| 4,952,524 | 8/1990 | Lee et al. ............................... | 438/437 |
| 5,387,540 | 2/1995 | Poon et al. ............................. | 438/433 |
| 5,674,775 | 10/1997 | Ho et al. ............................ | 148/DIG. 50 |
| 5,677,233 | 10/1997 | Abiko .............................. | 148/DIG. 50 |
| 5,801,083 | 9/1998 | Yu et al. ................................ | 438/435 |
| 5,874,317 | 2/1999 | Stolmeijer ........................ | 148/DIG. 50 |

*Primary Examiner*—Trung Dang
*Attorney, Agent, or Firm*—Ladas & Parry

[57] ABSTRACT

A method of fabricating a trench-isolation structure is provided. The fabricated trench-isolation structure in accordance with the present invention is formed on a semiconductor substrate. Sequentially, a buffer layer and a first isolating layer are formed to overlie the semiconductor substrate. After the first isolating layer is patterned to form an opening, the step of forming spacers on the sidewall of the opening follows. At the same time, within the range of the opening the portion of the buffer layer not covered by the spacers is removed to expose a portion of the semiconductor substrate. Then, the exposed semiconductor substrate is etched to form a trench. After a second isolating layer is formed on the peripherals of the trench, an isolation plug is filled in the trench.

20 Claims, 4 Drawing Sheets

METHOD FOR FABRICATING TRENCH-ISOLATION STRUCTURE

BACKGROUND OF THE INVENTION

1. Field of the Invention

The present invention generally relates to isolation technology for semiconductor integrated circuits. In particular, the present invention relates to a method for fabricating trench-isolation structures. The trench-isolation structure in accordance with the present invention can minimize bird's beak and oxidation stress occurring in the conventional LOCOS method, and can further decrease plasma-caused damage to substrates near active regions.

2. Description of the Prior Art

Because remarkable advances were made in semiconductor integrated circuit fabrication technology, device dimensions have been decreased from sub-micron to half-micron. In the nearest future, the device dimensions of 0.35 μm, 0.25 μm, 0.18 μm, or even 0.13 μm will be successively matured to industrial applications. The smaller the device dimensions, the greater the number of devices can be accumulated on a single chip. However, as the device dimensions approach the deep sub-half-micron region, the demand on the isolation structures for reliably isolating neighboring devices increases.

As disclosed in N. Shimizu, et al., "Poly-Buffer LOCOS Process for 256 Mbits Cells," IEDM-92, pp.279–282, field oxide is thermally grown by means of wet oxidation at temperature of around 1000¢XC, and nevertheless typically made to seven to ten times thicker than the gate oxide in active regions. The field oxide grows where there is no masking nitride, but at the edges of the nitride, some oxidant also diffuses laterally. This causes the oxide to grow underneath and lift the nitride edges. Because the shape of the oxide at the nitride edges is that of a slowly tapering oxide wedge, it has been named a bird's beak. This bird's beak encroachment limits the scaling of channel widths. In addition, the step of forming thick field oxide creates another problem during the wet oxidation process—intensifying mechanical stress at the bird's beak.

A. Bryant, et al., "Characteristics of CMOS Device Isolation for the ULSI Age," IEDM-94, pp.671–674 discloses a trench isolation to solve those aforementioned problems, such as bird's beak encroachment and local mechanical stressing. However, the step of forming trenches during plasma etching processes is vulnerable to causing plasma damage to the substrate near active regions and therefore induces a great number of defects.

SUMMARY OF THE INVENTION

Therefore, it is an object of the present invention to provide a method of fabricating a trench-isolation structure, which can minimize bird's beak encroachment and mechanical stressing due to short time oxidation.

Moreover, it is another object of the present invention to provide a method of fabricating a trench-isolation structure, whereby plasma damage that gives rise to defects during the formation of trenches can be decreased due to the protection of sidewall spacers.

Accordingly, the present invention provides a method of fabricating a trench-isolation structure, which is formed on a semiconductor substrate. A buffer layer and a first isolating layer are sequentially formed to overlie the semiconductor substrate. After the first isolating layer is patterned to form an opening, the step of forming spacers on the sidewall of the opening follows. At the same time, within the range of the opening the portion of the buffer layer not covered by the spacers is removed to expose a portion of the semiconductor substrate. Then, the exposed semiconductor substrate is etched to form a trench. After a second isolating layer is formed along the peripherals of the trench, an isolation plug is filled in the trench.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, a trench-isolation structure is formed between two adjacent semiconductor devices. In other words, the adjacent semiconductor devices are spaced by the trench-isolation structure and reliably isolated from each other thereby. Those semiconductor devices are fabricated on a semiconductor substrate 10. The semiconductor substrate 10 might be composed of silicon (Si), germanium(Ge), or gallium-arsenic(GaAs). The following preferred embodiment exemplifies a silicon substrate, but it is not intended to limit the scope of the present invention. With accompanied FIGS. 1–10, the method in accordance with the present invention will be described in detail.

Figure 1:
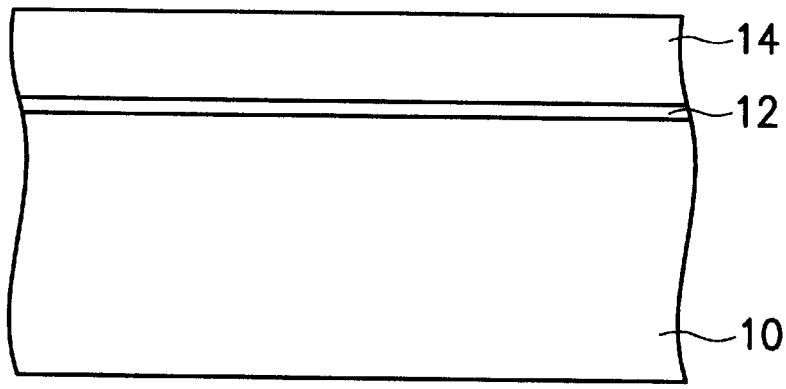
FIG. 1 schematically depicts a cross-sectional view of a buffer layer and a first isolating layer sequentially formed on a semiconductor substrate.

Refer first to FIG. 1, a buffer layer 12 and a first isolating layer 14 are sequentially formed on the semiconductor substrate 10 as schematically depicted in a cross-sectional view. Accordingly, the buffer layer 12 is first formed to overlie the semiconductor substrate 10. Preferably, the buffer layer 12 is a silicon oxide layer, formed by thermally oxidizing the surface of the substrate 10, as a pad oxide. The buffer layer 12 has a thickness of around 50–300 Å.

Thereafter, the first isolating layer 14 is formed on the buffer layer 12. Preferably, the first isolating layer 14 is a silicon nitride layer by means of either low-pressure chemical vapor deposition (LPCVD) or plasma-enhanced chemical vapor deposition (PECVD) processes. If the low-pressure chemical vapor deposition is applied, $SiH_4$ and $NH_3$ are used as source gases. Nevertheless, source gases $SiH_4$ and $N_2O$ are used while the plasma-enhanced chemical vapor deposition is applied. Preferably, the first isolating layer has a thickness of about 500–2500 Å.

Figure 2:
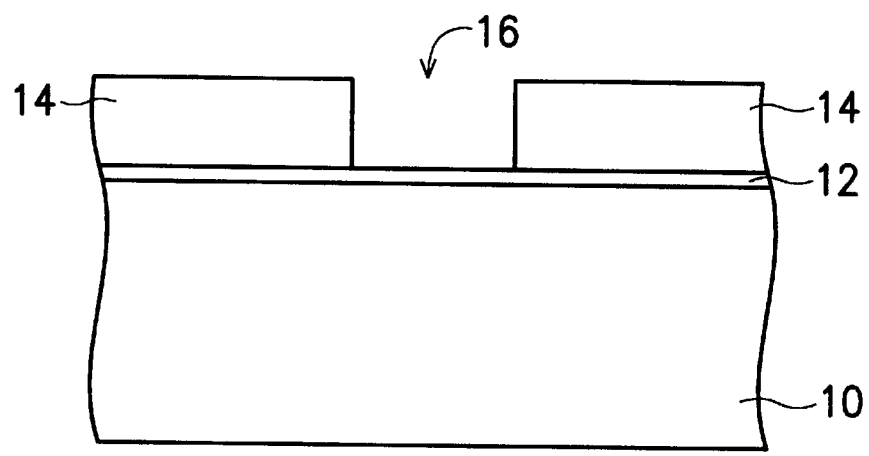
FIG. 2 schematically depicts a cross-sectional view of patterning the second isolating layer to form an opening.

Refer to FIG. 2, the first isolating layer 14 patterned to form an opening 16 is schematically depicted in a cross-sectional view. The range of the opening 16 is virtually equivalent of that of the formed trench-isolation structure. By means of a photolithography process including coating, baking, exposure, development, rinse, etc., a photo-resistant layer (not shown in the drawing) having a predetermined pattern of the opening 16 is formed on the first isolating layer 14. The first isolating layer 14 is subjected to an etching process by using the photoresist layer as masking to form the opening 16. Preferably, the etching process is implemented by reactive ion etching (RIE). Thereafter, the photoresist layer is removed.

Figure 3:
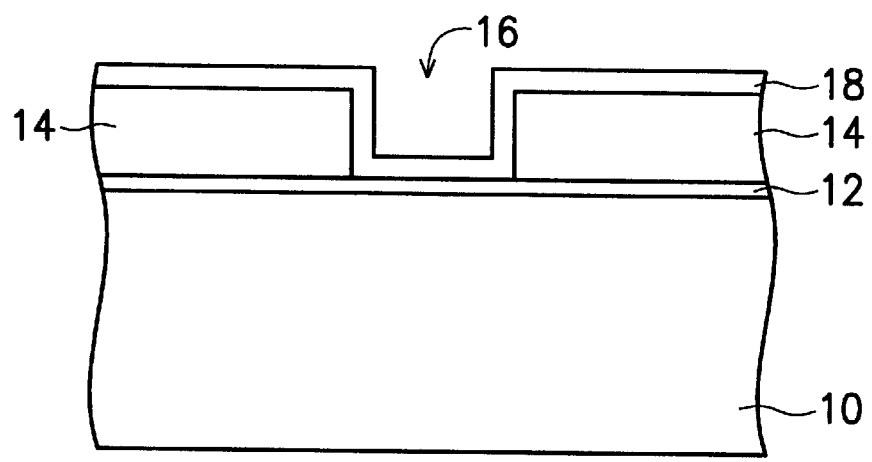
FIG. 3 schematically depicts a cross-sectional view of conformably forming a polysilicon layer over the surface of the substrate.
Figure 4:
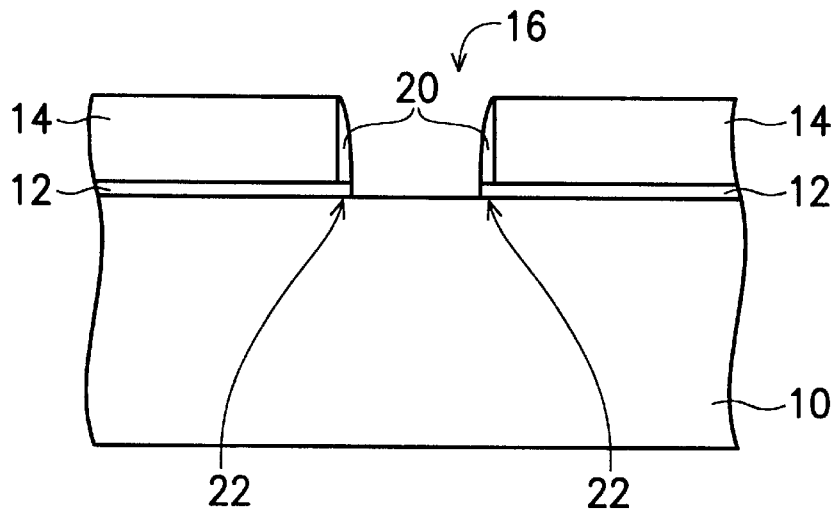
FIG. 4 schematically depicts a cross-sectional view of patterning the polysilcon layer to form sidewall spacers.

Then, as shown in FIG. 3, a polysilicon layer 18 conformably overlying on the overall surface over the substrate 10 is schematically depicted in a cross-sectional view. Accordingly, the polysilicon layer 18 is formed on the first isolating layer 14 and, simultaneously, formed on the sidewall and the bottom of the opening 16. Preferably, the polysilicon layer 18 is formed in a LPCVD reactor while using gas $SiH_4$ as a reactant. The polysilicon layer 18 ranges from about 200 Å to about 1000 Å in thickness. Subsequently, refer to FIG. 4, the polysilicon layer 18 is subjected to an etching back process to form spacers 20 remaining on the sidewall of the opening 16. At the same time, a portion of the buffer layer 12 not covered by the spacers 20 is etched away to expose the substrate 10. Note that the portions of the buffer layer 12 covered by the spacers 20 are overlapping portions 22.

Figure 5:
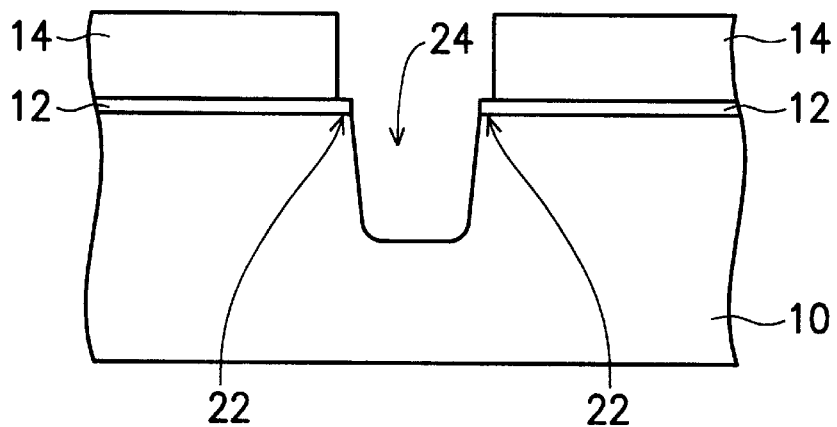
FIG. 5 schematically depicts a cross-sectional view of patterning the substrate to form a trench.

Refer to FIG. 5, the step of etching the exposed substrate 10 to form a trench 24 is schematically depicted in a cross-sectional view. While this step makes use of the first isolating layer 14 as well as the overlapping portion 22 as a mask, the exposed substrate 10 is etched to form the trench 24 through the opening 16. The trench 24 has a depth ranging from about 1500 Å to about 6000 Å, and a width of about 0.05 μm to about 10 μm. Preferably, the step of forming trench 24 is implemented by means of a plasma etching process. Note that the polysilicon spacers 20 will be gradually etched away if the semiconductor substrate 10 is the silicon substrate. As shown in FIG. 5, the spacers 24 are removed and the underlying overlapping portion 22 are exposed. Owing to the masking of the overlapping portion 22 the trench 24 has a width smaller than that of the opening 16. In addition, plasma damage to the substrate 10 near active regions during the plasma etching process can be greatly reduced on account of the protection of the spacers 20.

Figure 6:
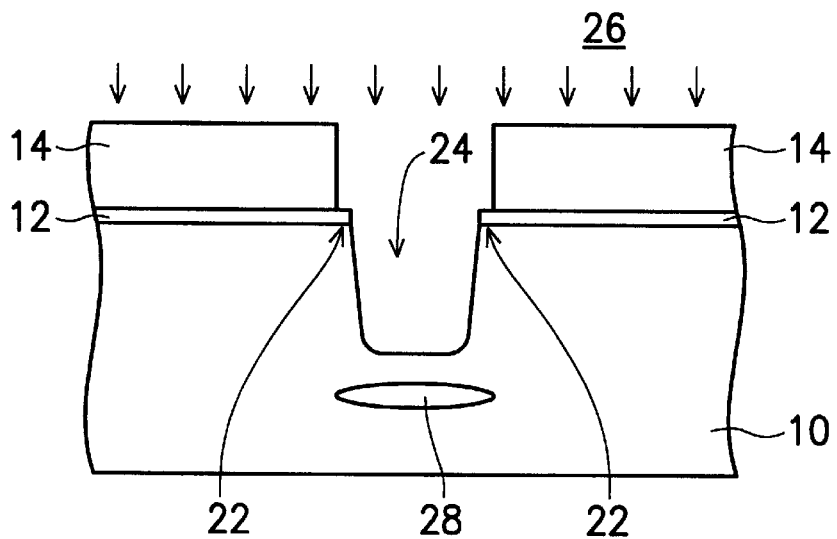
FIG. 6 schematically depicts a cross-sectional view of implanting impurities into the substrate to form a channel stop layer.
Figure 7:
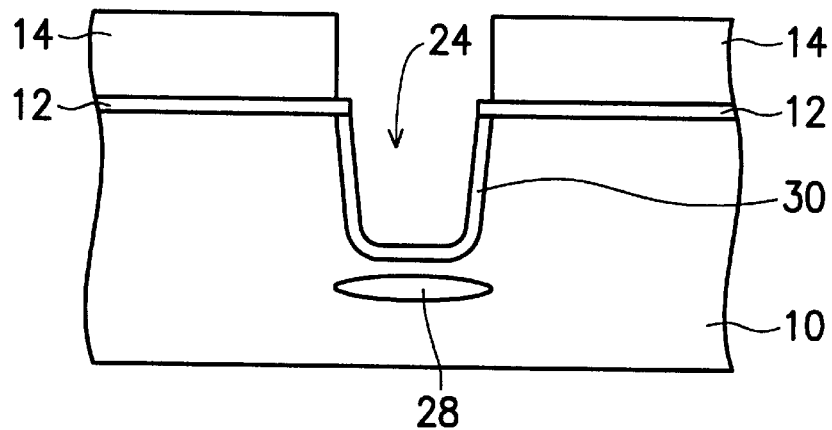
FIG. 7 schematically depicts a cross-sectional view of forming a second isolating layer along the peripherals of the trench.

Moreover, as shown in FIG. 6, impurities 26 are implanted into the substrate 10 through the trench 24 to form a channel stop layer 28. Preferably, the channel stop layer 28 is formed just underneath the bottom of the trench 24. Ordinarily, this step is named channel stop implanting. After the channel stop implanting process is applied, the threshold voltage for the channel stop layer 28 is raised. Preferably, the implanted impurities 26 might be boron or $BF_2$, the implant energy range at about 20–150 KeV, and the implant dosage range at about $5 \times 10^{11} – 5 \times 10^{13}$ $cm^{-2}$.

Since the substrate 10 has been patterned to form the trench 24, the exposed substrate 10 around peripherals of the trench 24 can be subjected to thermal oxidation to form a second isolating layer 30. The thickness of the second isolating layer 30 ranges from about 300 Å to about 1000 Å.

Figure 8:
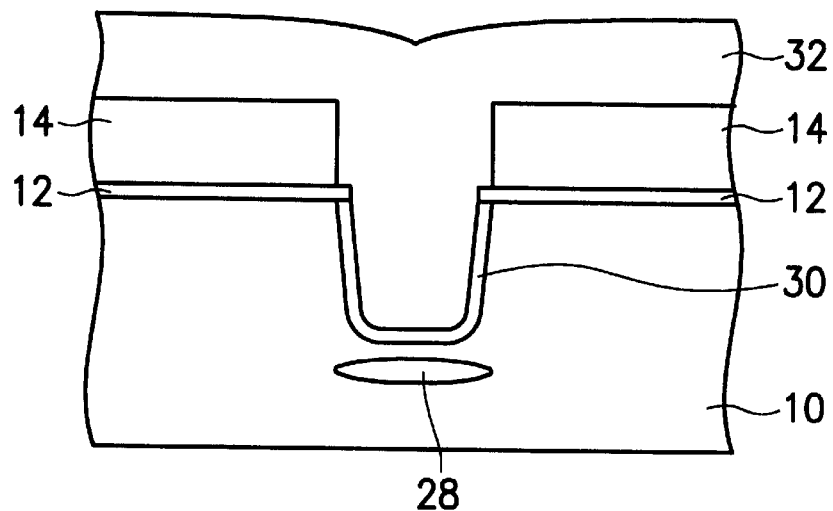
FIG. 8 schematically depicts a cross-sectional view of forming a third isolating layer overlying the first isolating layer and filling in the trench.

As compared with the thickness of field oxide grown by the conventional LOCOS method, the second isolating layer 30 is relatively thinner and the required oxidation period is greatly shortened. The formation of the second isolating layer 30 can recover and move away defects made from aforementioned plasma etching and implanting processes. Subsequently, as shown in FIG. 8, a third isolating layer 32 is formed to overlie the first isolating layer 14 and fill in the trench 24. Preferably, the third isolating layer 32 is a TEOS (Tetra-ethyl-ortho-silicate)-oxide layer or a BPSG (Borophosphosilicate) layer. The thickness of the third isolating layer 32 depends on the width of the trench 24. At least, the thickness of the third isolating layer 32 should be half of the trench width.

Figure 9:
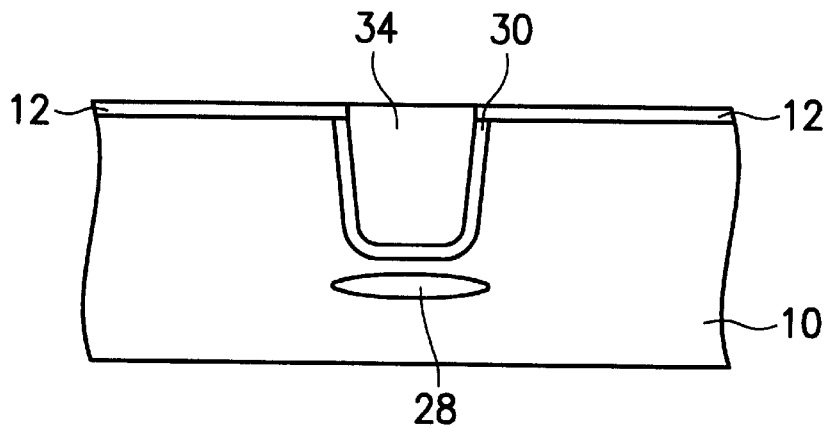
FIG. 9 schematically depicts a cross-sectional view of an isolating plug filled in the trench after a planarization process.

Thereafter, refer to FIG. 9, etching back process or chemical mechanical polishing (CMP) process is applied for planarization. From the top surface, the third isolating layer 32 and the first isolating layer 14 are sequentially etched or polished until all of the first isolating layer 14 is removed. Therefore, the portion of the third isolating layer 32 remaining within the trench 24 is named an isolating plug 34. Consequently, the method of fabricating the trench-isolation structure in accordance with the present invention is completed.

Figure 10:
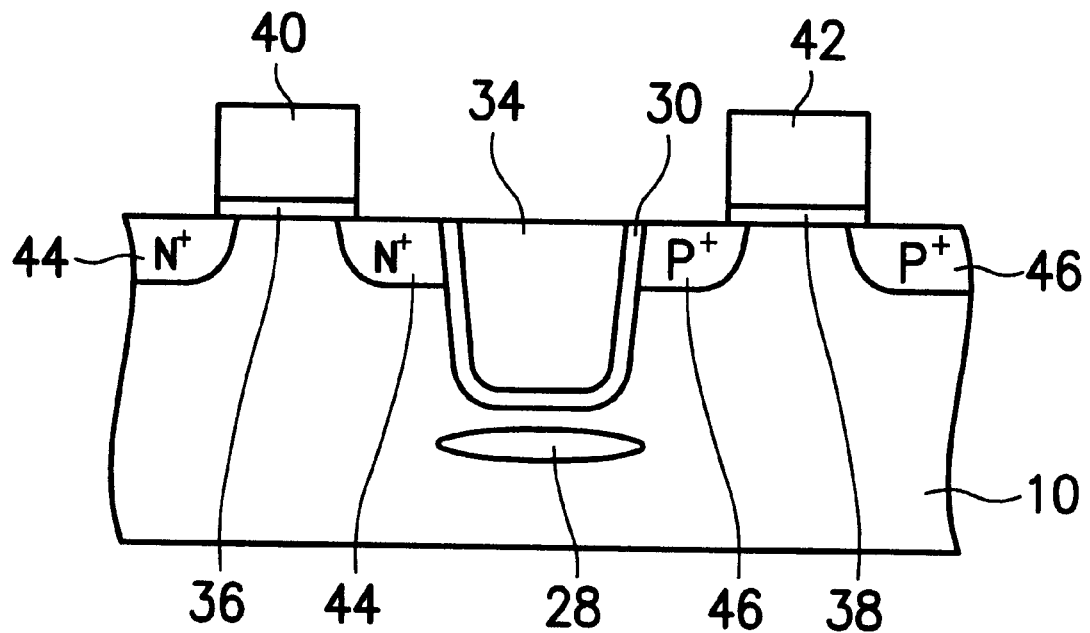
FIG. 10 schematically depicts a cross-sectional view of the fabricated trench-isolation structure arranged between two neighboring devices.

FIG. 10 schematically depicts that the fabricated trench-isolation structure shown in FIG. 9 is arranged between two adjacent devices in a cross-sectional view. In the drawing, an N-type metal-oxide-semiconductor field-effect transistor (MOSFET) is illustrated in the left to the isolating plug 34, and a P-type MOSFET device is illustrated in the right to the isolating plug 34. Reference numerals 36 and 38 represent gate oxide layers. Gate electrodes 40 and 42 are formed on the gate oxide layers 36 and 38, respectively. In addition, reference numerals 44 and 46 represent a pair of N-type doped regions and a pair of P-type doped regions formed in the substrate 10. Accordingly, the N-type MOSFET device and the P-type MOSFET are spaced apart from each other by the trench-isolation structure. As shown in FIG. 9, the trench-isolation structure, in accordance with the present invention, is comprised of the isolating plug 34, the second isolating layer 30 and the channel stop layer 28.

In conclusion, the method for fabricating the trench-isolation structure forms the trench-isolation structure between two adjacent devices. The trench-isolation structure, in accordance with the present invention, is comprised of the isolating plug, the second isolating layer, and the channel stop layer. Although the formation of second isolating layer is performed by means of thermal oxidation, the processing period is greatly shorter than that for forming the conventional field oxide. Therefore, the fabricated trench-isolation can minimize bird's beak and oxidation stress occurring in the conventional LOCOS method. Furthermore, the protection of the spacers can minimize plasma-caused damage to the substrate near active regions.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical applications, thereby enables others skilled in the art to understand the invention to practice various other embodiments and make various modifications suited to the particular use contemplated. It is intended that the scope of the invention be defined by the following claims and their equivalents.

What is claimed is:

1. A method for fabricating a trench-isolation structure comprising the following steps of:

(a) providing a silicon substrate;

(b) forming a buffer layer overlying said silicon substrate;

(c) forming a nitride layer overlying said buffer layer;

(d) patterning said nitride layer to form an opening;

(e) forming a polysilicon layer conformably overlying said nitride layer;

(f) etching back said polysilicon layer to form spacers on sidewalls of said opening;

(g) removing a portion of said buffer layer not covered by said spacers to expose said substrate;

(h) etching said exposed substrate to form a trench, and removing said spacers;

(i) forming a channel stop layer in said substrate below said trench;

(j) oxidizing portions of said substrate around said trench to form an oxide layer;

(k) forming an isolating layer at least filling in said trench;

(l) planarizing said isolating layer to form an isolating plug remaining in said trench.

2. The method as claimed in claim 1, wherein said buffer layer is a silicon oxide layer.

3. The method as claimed in claim 1, wherein the step (e) for forming said spacers comprises:

forming a polysilicon layer conformably overlying overall surface over said substrate; and etching back said polysilicon layer to form said spacers.

4. The method as claimed in claim 1, wherein the step (i) is performed by means of an ion implantation process.

5. The method as claimed in claim 1, wherein said isolating layer is a TEOS-oxide layer.

6. The method as claimed in claim 1, wherein said isolating layer is a BPSG layer.

7. The method as claimed in claim 1, wherein the step (l) is performed by etching back.

8. The method as claimed in claim 1, wherein the step (l) is performed by chemical mechanical polishing.

9. A method for fabricating a trench-isolation structure comprising the following steps of:

(a) providing a semiconductor substrate;

(b) forming a buffer layer overlying said substrate;

(c) forming a first isolating layer overlying said buffer layer;

(d) patterning said first isolating layer to form an opening;

(e) forming a polysilicon layer conformably overlying said first isolation layer;

(f) etching back said polysilicon layer to form spacers on sidewalls of said opening;

(g) removing a portion of said buffer layer not covered by said spacers to expose said substrate;

(h) etching said exposed substrate to form a trench;

(i) forming a second isolating layer around peripherals of said trench; and (j) forming an isolating plug filling in said trench.

10. The method as claimed in claim 9, wherein said buffer layer is a silicon oxide layer.

11. The method as claimed in claim 9, wherein said first isolating layer is a silicon nitride layer.

12. The method as claimed in claim 9, wherein the step (e) for forming said spacers comprises:

forming a polysilicon layer conformably overlying overall surface over said substrate; and etching back said polysilicon layer to form said spacers.

13. The method as claimed in claim 9, between steps (h) and (i), further comprising the step of implanting impurities into said substrate through said trench to form a channel stop layer.

14. The method as claimed in claim 9, wherein said semiconductor substrate is a silicon substrate.

15. The method as claimed in claim 14, wherein said second isolating layer is a thermally-grown silicon oxide layer.

16. The method as claimed in claim 9, wherein the step (h) comprises:

forming a third isolating layer at least filling in said trench; and planarizing said third isolating layer to form said isolating plug.

17. The method as claimed in claim 16, wherein said third isolating layer is a TEOS-oxide layer.

18. The method as claimed in claim 16, wherein said isolating layer is a BPSG layer.

19. The method as claimed in claim 16, wherein the planarizing step is performed by etching back.

20. The method as claimed in claim 16, wherein the planarizing step is performed by chemical mechanical polishing.

* * * * *